United States Patent [19]

Hori et al.

[11] Patent Number: 5,042,042
[45] Date of Patent: Aug. 20, 1991

[54] WAVELENGTH AND OUTPUT POWER STABILIZING APPARATUS FOR SEMICONDUCTOR LASER

[75] Inventors: Nobuo Hori; Fumio Ohtomo; Takumi Uchiyama, all of Tokyo, Japan

[73] Assignee: Kabushiki Kaisha Topcon, Tokyo, Japan

[21] Appl. No.: 342,788

[22] Filed: Apr. 25, 1989

[51] Int. Cl.⁵ .............................................. H02S 3/13
[52] U.S. Cl. ........................................ 372/32; 372/34; 372/38
[58] Field of Search .................... 372/29, 30, 31, 32, 372/33, 34, 38

[56] References Cited

U.S. PATENT DOCUMENTS

| | | | |
|---|---|---|---|
| 4,792,956 | 12/1988 | Kamin | 372/29 |
| 4,815,081 | 3/1989 | Mahlein et al. | 372/32 |
| 4,821,273 | 4/1989 | Hori | 372/31 |

*Primary Examiner*—Frank Gonzalez
*Attorney, Agent, or Firm*—Finnegan, Henderson, Farabow, Garrett & Dunner

[57] ABSTRACT

An output power and wavelength stabilizing apparatus of a semiconductor laser has an injection current supplying source adapted to supply injection current to a single-mode semiconductor laser, a first light receiving portion adapted to receive a part of the output power of the semiconductor laser through a first optical element with varying spectral characteristics in the wavelength area of the semiconductor laser and to output a first signal, a second light receiving portion adapted to receive a part of the output power of the semiconductor laser through a second optical element with varying spectral characteristics opposite to that of the first optical element and to output a second signal, a wavelength fluctuation detecting portion for producing a difference signal related to the first signal and the second signal and obtaining a fluctuation of the wavelength of the semiconductor laser based on the difference signal, an output fluctuation detecting portion for producing a signal related to the sum of the first and the second signals and obtaining the fluctuation of output power of the semiconductor laser based on the sum signal, and a temperature control portion for controlling the temperature of the semiconductor laser to a predetermined operating temperature based on the fluctuation of the output power of the semiconductor laser obtained by the output power fluctuation detecting portion so that the output power of the semiconductor laser can be maintained constant. The injection current supplying source is used to control the wavelength of the semiconductor laser based on the fluctuation of the wavelength of the semiconductor laser obtained by the wavelength fluctuation detecting portion such that the wavelength remains constant.

8 Claims, 2 Drawing Sheets

WAVELENGTH AND OUTPUT POWER STABILIZING APPARATUS FOR SEMICONDUCTOR LASER

FIELD OF THE INVENTION

This invention relates to a wavelength and output power stabilizing apparatus for a semiconductor laser, and particularly to a wavelength and output power stabilizing apparatus which is capable of stabilizing the wavelength and output power of a single-mode semiconductor laser, (also referred to as a "laser diode" or "LD").

BACKGROUND OF THE INVENTION

In recent years, semiconductor lasers have been used in various equipment including optical systems since the energy efficiency of a semiconductor laser is high.

Semiconductor lasers often are subject to undesirable variation in the wavelength and output power because of fluctuations in the operating temperature of the semiconductor laser.

Also, the wavelength and output power fluctuate because of variations in the injection current of a current supply source. (For example, see a search report under the title of "Frequency and Power Stabilizations of GaAlAs Diode Laser on an Opto galvanic Effect" of Shingaku Giho Vol. 82. No. 218, OQE-99 of Technical Search Report of Denshitsushin Gakkai; OQE82-95 to 106 (issued on Jan. 17, 1983)).

The present applicant has filed an application (see Japanese Patent Early Laid-open Publication No. Sho 62-244184, Japanese Patent Application No. Sho 61-87349 filed on Apr. 16, 1986) regarding an apparatus for stabilizing wavelength and output power of a semiconductor laser. The apparatus described in this Japanese Patent Early Laid-open Publication Sho 62-244184 is designed such that injection current is adequately controlled to stabilize the wavelength. The injection current is controlled based on light received through an interference filter. The interference filter has varying spectral characteristics in wavelength range of semiconductor coherent light emission. For example, the interference filter may increase in transmittance with an increase in wavelength, or vice-versa. Additionally, the operating temperature is controlled to stabilize the output power of the semiconductor laser.

The apparatus described in this Japanese Patent Early Laid-open Publication No. Sho 62-244184 can stabilize the wavelength and output power of the semiconductor laser to some extent. However, when a highly accurate measurement is required, for example in a gage interferometer, etc., a higher degree of stabilization is demanded.

In the apparatus described in the above-mentioned Japanese Patent Early Laid-open Publication No. Sho 62-244184, the stabilization of wavelength and output power depends upon the spectral characteristics of the interference filter. Also, the stabilization depends upon variations in a reference voltage used as a reference for detecting wavelength fluctuation. The reference voltage is compared with a signal showing the wavelength variation of the light which has passed through the interference filter. The reason why the degree of the amplitude change with wavelength in the spectral characteristics of the interference filter contributes to the stabilization of the wavelength is that the control signal controls the injection current, to which the wavelength quickly responds.

If transmissivity of the interference filter changes rapidly with a small change in wavelength, selected small changes in wavelength can be more easily detected. However, this narrows the range of wavelengths which may be detected and controlled by a given interference filter.

Also, the reference voltage may fluctuate over time from various known causes, such as aging of components.

Furthermore, the signal which represents the wavelength fluctuation of the laser light fluctuation of the output power of the laser. Therefore, the feed back system compares the reference voltage with the signal which represents the wavelength fluctuation. This feed back system has the shortcoming that it cannot correct wavelength variations caused by the fluctuation of the output power of the semiconductor laser.

SUMMARY OF THE INVENTION

It is therefore an object of the present invention to provide an output power and wavelength stabilizing apparatus of a semiconductor laser in which the wavelength is stabilized while reducing the wavelength variation caused by fluctuations in the output power and by fluctuations in the reference voltage, and in which output power is also stabilized.

In order to achieve the above-mentioned object, an output power and wavelength stabilizing apparatus of a semiconductor laser according to the present invention includes an injection current supplying source adapted to supply injection current to a single-mode semiconductor laser;

a first light receiving portion adapted to receive a part of output power of the semiconductor laser through a first optical element which is varied by increasing its spectral characteristics in the wavelength area of the semiconductor laser and to output a first signal;

a second light receiving portion adapted to receive a part of output power of the semiconductor laser through a second optical element which is varied by decreasing its spectral characteristics in the wavelength area of the semiconductor laser and to output a second signal;

a wavelength fluctuation detecting portion for making a difference signal by obtaining a difference between the first signal and the second signal and obtaining a fluctuation of the wavelength of the semiconductor laser based on the difference signal;

an output fluctuation detecting portion for making a sum signal by taking a sum of the first and the second signals and obtaining a fluctuation of output power of the semiconductor laser based on the sum signal; and a temperature control portion for controlling the temperature of the semiconductor laser to a predetermined operating temperature based on the fluctuation of the output power of the semiconductor laser obtained by said output power fluctuation detecting portion so that the output power of the semiconductor laser can be maintained constant;

said injection current supplying source controlling the wavelength of the semiconductor laser based on the fluctuation of the wavelength of the semiconductor laser obtained by said wavelength fluctuation detecting portion to be constant.

DESCRIPTION OF THE PREFERRED EMBODIMENT

One embodiment of a wavelength and output power stabilizing apparatus of a semiconductor laser according to the present invention will be described with reference to the accompanying drawings.

Figure 1:
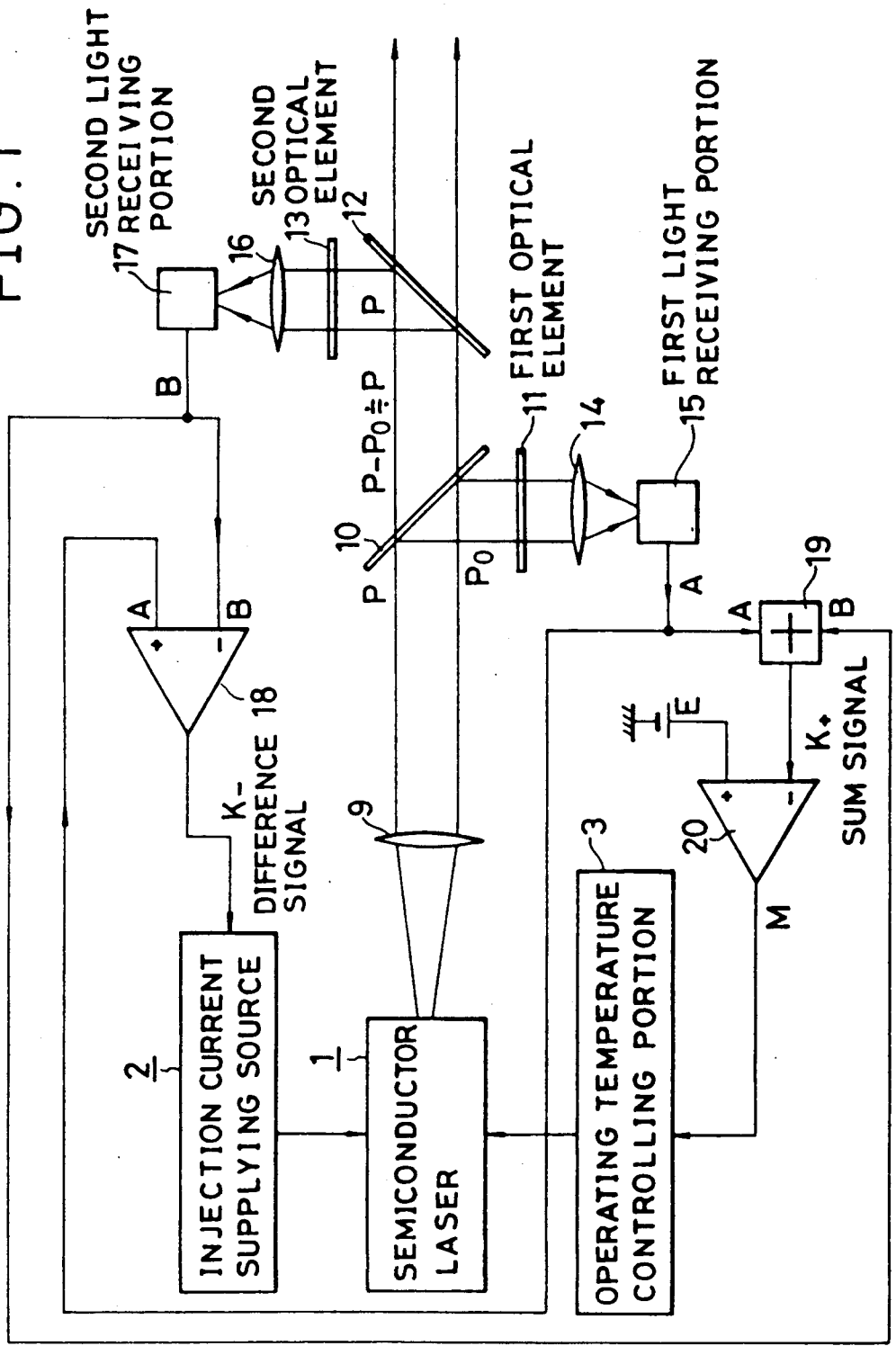
FIG. 1 is a block diagram showing a portion of a wavelength and output power stabilizing apparatus of a semiconductor laser according to the present invention.

FIG. 1 is an illustration showing a portion of a wavelength and output power stabilizing apparatus of a semiconductor laser according to the present invention.

Figure 2:
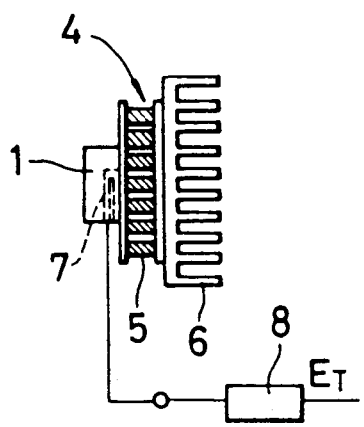
FIG. 2 is an illustration showing one example of a thermoelectric converter which is used in a wavelength and output power stabilizing apparatus of a semiconductor laser according to the present invention.

In this figure, 1 denotes a semiconductor laser, 2 an injection current supplying source and 3 an operating temperature controlling portion. As is shown in FIG. 2, the semiconductor laser 1 is mounted on a thermoelectric converter 4 which constitutes a part of the operating temperature controlling portion 3 in order to maintain the stabilization of the operating temperature. This thermoelectric converter 4 includes a Peltier element 5 and a radiating plate 6. The semiconductor laser 1 is located at an opposite side to the radiating plate 6 with the Peltier element 5 placed therebetween. The semiconductor laser 1 is provided with a thermistor 7 for detecting the operating temperature. The operating temperature detected is converted to a voltage $E_T$ by a temperature-voltage converting circuit 8. This voltage $E_T$ is used in cooperation with a compensating output power of an output power fluctuation detecting portion as will be described. The function of the operating temperature controlling portion will be described later.

The semiconductor laser 1 used herein is preferably a single-mode semiconductor laser. The laser beam emitted by the semiconductor laser 1 is collimated by a collimating lens 9. The collimated beam is guided to a first beam splitter 10. A part of the collimated beam is reflected by the first beam splitter 10 toward a first optical element 11. Assuming the quantity of reflected light is represented by $P_0$ and the quantity of light of the collimated beam immediately before being made incident to the first beam splitter 10 by P, the light quantity of the collimated beam passing through the beam splitter 10 can be represented by $P - P_0$. The collimated beam passing through the first beam splitter 10 is guided to a second beam splitter 12. A part of the collimated beam is reflected by the second beam splitter 12 toward a second optical element 13.

If only a small portion of the collimated beam is reflected by the first beam splitter 10, i.e. $P_0$ is small. The light quantity of the collimated beam before passing through the first beam splitter 10 can be regarded as the same as the light quantity of the collimated beam after passing through the first beam splitter 10, i.e. $P \simeq P - P_0$. If the reflectance (transmittance) of the second beam splitter 12 is made equal to that of the first beam splitter 10, a similar assumption may be made; and also the quantity of light reflected by the second beam splitter 12 may be considered equal to the quantity of light reflected by the first beam splitter 10.

Figure 3:
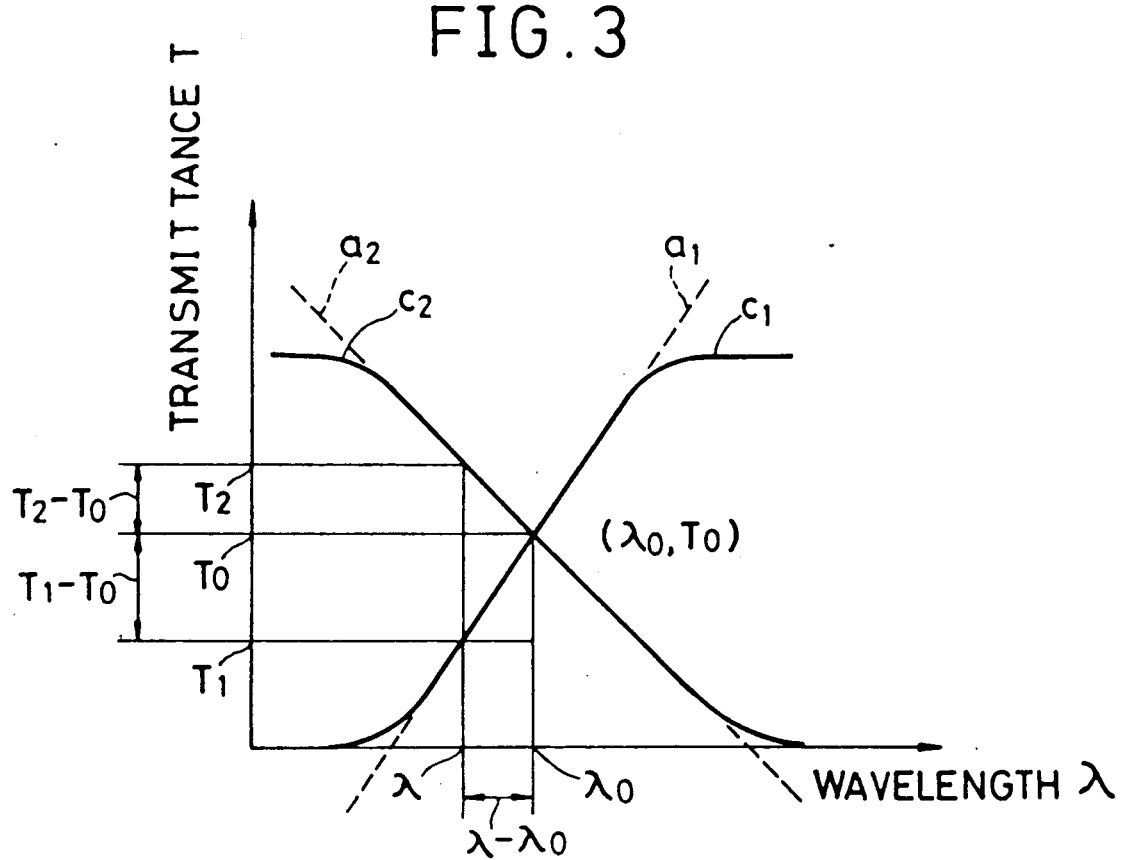
FIG. 3 is an illustration showing the spectral characteristics of a first and a second optical elements according to the present invention.

The first optical element 11 and the second optical element 13 used herein are interference filters. The first optical element 11, as shown in FIG. 3, has spectral characteristics as shown by curve $C_1$. Curve $C_1$ shows the functional relation between a wavelength λ and a transmittance T. In the wavelength range of the semiconductor laser 1, the transmittance T increases as the wavelength λ is increased. The second optical element 13 has spectral characteristics as shown by curve $C_2$, where the transmittance T is decreased, in the wavelength area of the semiconductor laser 1, as the wavelength λ is increased.

For the following analysis, presume that the stabilization of the semiconductor laser 1 is desired at wavelength $\lambda_0$. Also, presume that the transmittance in the wavelength $\lambda_0$ is represented by $T_0$, the slope at point ($\lambda_0$, $T_0$) of the spectral characteristic curve $C_1$ is represented by $a_1$, and the slope at point ($\lambda_0$, $T_0$) of the spectral characteristic curve $C_2$ is represented by $-a_2$ ($a_2$ being a positive number).

Referring to FIG. 3 and focusing on the vicinity of the point ($\lambda_0$, $T_0$) the transmittance $T_2$ of the spectral characteristic curve $C_1$ in the wavelength λ can be expressed as follows:

$$T_1 - T_0 = a_1(\lambda - \lambda_0)$$

or $$T_1 = a_1(\lambda - \lambda_0) + T_0$$

On the other hand, if attention is paid to the vicinity, the transmittance $T_2$ of the spectral characteristic curve $C_2$ in the wavelength λ can be expressed as follows:

$$T_2 - T_0 = -a_2(\lambda - \lambda_0)$$

or $$T_2 = -a_2(\lambda - \lambda_0) + T_0$$

Thus, if the transmitted light quantity of the reflecting light of reflected light quantity $P_0$ in the wavelength λ through the first and the second optical elements 11 and 13 are represented by $P_1$ and $P_2$ respectively, the light quantity $P_1$ transmitted through the first optical element 11 can be expressed as follows:

$$P_1 = T_1 \cdot P_0 = (a_1(\lambda - \lambda_0) + T_0) \cdot P_0 \qquad (1)$$

and the light quantity $P_2$ of transmitted through the second optical element 13 can be expressed as follows:

$$P_2 = T_2 \cdot P_0 = (-a_2(\lambda - \lambda_0) + T_0) \cdot P_0 \qquad (2)$$

Light transmitted through the first optical element 11 is condensed to a first light receiving portion 15 by a condenser lens 14. Light transmitted through the second optical element 13 is condensed to a second light receiving portion 17 by a condenser lens 16. The sensitivity of the first and the second light receiving portions 15 and 17 is represented by S. Then, the output signal A of the first light receiving portion 15, which is based on the light transmitted through the first optical element 11, can be expressed, based in part on the above relation (1), as follows:

$$A = (a_1(\lambda - \lambda_0) + T_0) \cdot P_0 \cdot S \quad (3)$$

and the output signal B of the second light receiving portion 17, which is based on the light transmitted through the second optical element 13 can be expressed, based in part on the above relation (2), as follows:

$$B = (-a_2(\lambda - \lambda_0) + T_0) \cdot P_0 \cdot S \quad (4)$$

The output signals A and B are input into an operation amplifier 18 functioning as a wavelength fluctuation detecting portion and an adder 19 functioning as a part of an output power detecting portion. The operation amplifier 18 detects the difference between the output signals A and B and outputs a difference signal K to the injection current supplying source 2. If the gain of the operation amplifier 18 is 1, $$\begin{aligned} K &= A - B = (P_1 - P_2) \cdot S \\ &= \{a_1(\lambda - \lambda_0) + T_0\} \cdot P_0 \cdot S = (-a_2(\lambda - \lambda_0) + T_0\} \cdot P_0 \cdot S \\ &= (a_1 + a_2) \cdot (\lambda - \lambda_0) \cdot P_0 \cdot S \end{aligned} \quad (5)$$

In this relation (5), if difference signal $K_- = 0$, then $(a_1+a_2)\cdot(\lambda-\lambda_0)\cdot P_0\cdot S = O$, since $(a_1+a_2)$ is positive and $P_0\cdot S$ is positive, therefore, $\lambda - \lambda_0 = 0$.

If the injection current supplying source 2 is controlled such that the difference signal $K_-$ becomes zero, then $\lambda = \lambda_0$, irrespective of the output power of the semiconductor laser 1. The wavelength of the semiconductor laser 1 can be stabilized at $\lambda_0$. Therefore, the wavelength of the semiconductor laser 1 can be stabilized while reducing wavelength fluctuation caused by variations in the output power and the reference voltage.

By summing the output signals A and B, the adder 19 produces a sum signal $K_+$. This sum signal $K_+$ is output to one terminal of the operation amplifier 20. The other terminal receives the reference voltage E. The operation amplifier 20 and the adder 19 function as an output power fluctuation detecting portion for finding the output power fluctuation of the semiconductor 1 based on the sum signal. That is, the operation amplifier 20 outputs a compensating output signal M, based on the output power fluctuation of the laser, to the operating temperature controlling portion 3. Based on the voltage E and the sum signal $K_+$, the operating temperature controlling portion 3 controls the Peltier element 5 as such that the semiconductor laser 1 is cooled by the Peltier element 5 when the detected operating temperature is higher than a predetermined operating temperature. Also, the operating temperature controlling portion 3 controls the Peltier element 5 as such that the semiconductor laser 1 is heated by the Peltier element 5 when the detected operating temperature is lower than the predetermined operating temperature. Therefore, the operating temperature controlling portion 3 controls the temperature of the semiconductor laser 1 to be the predetermined operating temperature so that the output power of the semiconductor laser 1 can be stabilized at the predetermined operating temperature.

From the relations (8) and (4), the sum signal $K_+$ may be derived as follows;

$$\begin{aligned} K_+ &= A + B = (P_1 + P_2) \cdot S \\ &= \{a_1(\lambda - \lambda_0) + T_0\} \cdot P_0 \cdot S + \\ &\quad \{-a_2(\lambda - \lambda_0) + T_0\} \cdot P_0 \cdot S \\ &= \{a_1 - a_2\} \cdot (\lambda - \lambda_0) \cdot P_0 \cdot S + 2T_0 \cdot P_0 \cdot S \end{aligned} \quad (8)$$

Since the wavelength $\lambda$ is maintained at $\lambda = \lambda_0$ by the wavelength fluctuation detecting portion and is unaffected by fluctuation of the output power of the laser, the sum signal $K_-$ may be represented as follows;

$$K_- = 2T_0 \cdot P_0 \cdot S \quad (7)$$

Therefore, if the operating temperature ET of the laser is controlled such that the sum signal $K_{31}$ is equal in magnitude to the reference voltage E, the fluctuation of the output power caused by operating temperature fluctuation can be restrained.

If the slope $a_1$ of the first spectral characteristic curve $C_1$ at point $(\lambda_0, T_0)$ and the absolute value of the slope $a_2$ of the second spectral characteristic curve $C_2$ at point $(\lambda_0, T_0)$ are set to be equal to each other, the relation (7) is valid irrespective of the fluctuation of the wavelength. Therefore, the fluctuation of the wavelength and the fluctuation of the output power can be controlled independently of each other.

As apparent from the foregoing description, since the wavelength fluctuation is measured and controlled without regard to a reference voltage, the wavelength fluctuation caused by drift of the reference voltage can be avoided. Also, the wavelength fluctuation can be reduced irrespective of any fluctuation in the output power.

What is claimed is:

1. An output power and wavelength stabilizing apparatus of a semiconductor laser comprising:

a first light receiving portion for producing a first signal adapted to receive a part of the output power of the semiconductor laser through a first optical element with an increasing spectral transmissivity with respect to increasing wavelength in the wavelength range of the semiconductor laser;

a second light receiving portion for producing a second signal adapted to receive a part of the output power of the semiconductor laser through a second optical element with a decreasing spectral transmissivity with respect to increasing wavelength in the wavelength range of the semiconductor laser;

a wavelength fluctuation detecting portion for producing a difference signal related to the first signal and the second signal and for determining the wavelength fluctuation of the semiconductor laser based on the difference signal;

an output fluctuation detecting portion for producing a summed signal by summing the first and the second signals and for determining the fluctuation of the output power of the semiconductor laser based on the summed signal; and a temperature control portion for controlling the temperature of the semiconductor laser to a predetermined constant operating temperature based on the fluctuation of the output power of the semiconductor laser;

an injection current supplying source adapted to supply injection current to a single-mode semiconductor laser, said injection current supplying source controlling the wavelength of the semiconductor laser based on the wavelength fluctuation of the semiconductor laser to cause the wavelength to be constant.

2. A wavelength and output power stabilizing apparatus of a semiconductor laser according to claim 1, wherein said first optical element and said second optical element each comprise an interference filter.

3. An output power and wavelength stabilizing apparatus of a semiconductor laser comprising:

a first beam splitter adapted to reflect a part of the laser beam of the semiconductor laser;

a first light receiving portion for producing a first signal adapted to receive the laser beam reflected by said first beam splitter through a first optical element with an increasing spectral transmissivity with respect to increasing wavelength in the wavelength range of the semiconductor laser;

a second beam splitter adapted to reflect a part of the laser beam transmitted through said first beam splitter;

a second light receiving portion for producing a second signal adapted to receive the laser beam reflected by said second beam splitter through a second optical element with a decreasing spectral transmissivity with respect to increasing wavelength in the wavelength range of the semiconductor laser;

a wavelength fluctuation detecting portion for producing a difference signal related to the first signal and the second signal and for determining the wavelength fluctuation of the semiconductor laser based on the difference signal;

an output fluctuation detecting portion for producing a summed signal by summing the first and the second signals and for determining the fluctuation of the output power of the semiconductor laser based on the summed signal; and a temperature control portion for controlling the temperature of the semiconductor laser to a predetermined constant operating temperature based on the fluctuation of the output power of the semiconductor laser;

an injection current supplying source adapted to supply injection current to a single-mode semiconductor laser, said injection current supplying source controlling the wavelength of the semiconductor laser based on the wavelength fluctuation of the semiconductor laser to cause the wavelength to be constant.

4. A wavelength and output power stabilizing apparatus of a semiconductor laser according to claim 3, wherein said first beam splitter and said second beam splitter each reflect a comparably small amount of light.

5. A wavelength and output power stabilizing apparatus of a semiconductor laser according to claim 4, wherein said temperature controlling portion controls the detected operating temperature such that the summed signal is substantially equal to the reference voltage.

6. A wavelength and output power stabilizing apparatus of a semiconductor laser according to claim 4, wherein the absolute value of the slope of said first optical element and the absolute value of the slope of said second optical element are substantially equal to each other.

7. An output power and wavelength stabilizing apparatus of a semiconductor laser comprising:

a first light receiving means for producing a first signal by receiving a part of the output power of the semiconductor laser through a first optical element with an increasing spectral transmissivity with respect to increasing wavelength in the wavelength range of the semiconductor laser;

a second light receiving means for producing a second signal by receiving a part of the output power of the semiconductor laser through a second optical element with a decreasing spectral transmissivity with respect to increasing wavelength in the wavelength range of the semiconductor laser;

a wavelength fluctuation detecting portion for producing a difference signal related to the first signal and the second signal and for detecting the wavelength fluctuation of the semiconductor laser based on the difference signal;

an injection current supplying source adapted to supply injection current to a single-mode semiconductor laser, said injection current supplying source controlling the wavelength of the semiconductor laser based on the wavelength fluctuation of the semiconductor laser to cause the wavelength to be constant.

8. The output power and wavelength stabilizing apparatus of a semiconductor laser according to claim 7, wherein said wavelength fluctuation detecting portion is connected to said injection current supplying source by a feedback loop to control said injection current supplying source by said difference signal.

* * * * *